(12) United States Patent
Kousai

(10) Patent No.: US 8,565,705 B2
(45) Date of Patent: Oct. 22, 2013

(54) OSCILLATOR CIRCUIT, RADIO COMMUNICATION DEVICE AND SEMICONDUCTOR INTEGRATED CIRCUIT

(75) Inventor: Shouhei Kousai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 238 days.

(21) Appl. No.: 13/231,638

(22) Filed: Sep. 13, 2011

(65) Prior Publication Data

US 2012/0142287 A1    Jun. 7, 2012

(30) Foreign Application Priority Data

Dec. 6, 2010  (JP) ................................. 2010-271543

(51) Int. Cl.
  *H04B 1/06*  (2006.01)
  *H03B 5/04*  (2006.01)

(52) U.S. Cl.
  USPC .......... 455/255; 455/86; 331/108 C; 331/176; 331/177 V; 375/294; 375/376

(58) Field of Classification Search
  USPC ............. 455/84, 86, 255, 258, 260, 264, 265; 331/15, 108 C, 108 R, 109, 175, 176, 331/177 R, 177 V; 375/293, 294, 375, 376
  See application file for complete search history.

(56) References Cited

U.S. PATENT DOCUMENTS

| | | | | |
|---|---|---|---|---|
| 5,585,764 A * | 12/1996 | Ling | ............................. | 331/109 |
| 6,850,101 B1 * | 2/2005 | De Stasi | ........................ | 331/143 |
| 6,917,249 B1 * | 7/2005 | Kuo et al. | ................. | 331/177 R |
| 7,724,100 B2 * | 5/2010 | Gong et al. | ................... | 331/175 |
| 2010/0164638 A1 | 7/2010 | Saw | | |
| 2010/0271144 A1 | 10/2010 | McCorquodale et al. | | |

FOREIGN PATENT DOCUMENTS

JP         2000-349598        12/2000

* cited by examiner

*Primary Examiner* — Quochien B Vuong
(74) *Attorney, Agent, or Firm* — White & Case LLP

(57) ABSTRACT

According to one embodiment, an oscillator circuit includes a first comparator circuit, a second comparator circuit, a first voltage control circuit, a second voltage control circuit, a clock generation circuit. The first comparator circuit is configured to compare a first voltage with a first threshold voltage to generate a first comparison result. The second comparator circuit is configured to compare a second voltage with a second threshold voltage to generate a second comparison result. The first voltage control circuit is configured to decrease the first voltage by a first voltage value in synchronization with timing when the first comparison result changes. The second voltage control circuit is configured to decrease the second voltage by a second voltage value in synchronization with timing when the second comparison result changes.

20 Claims, 11 Drawing Sheets

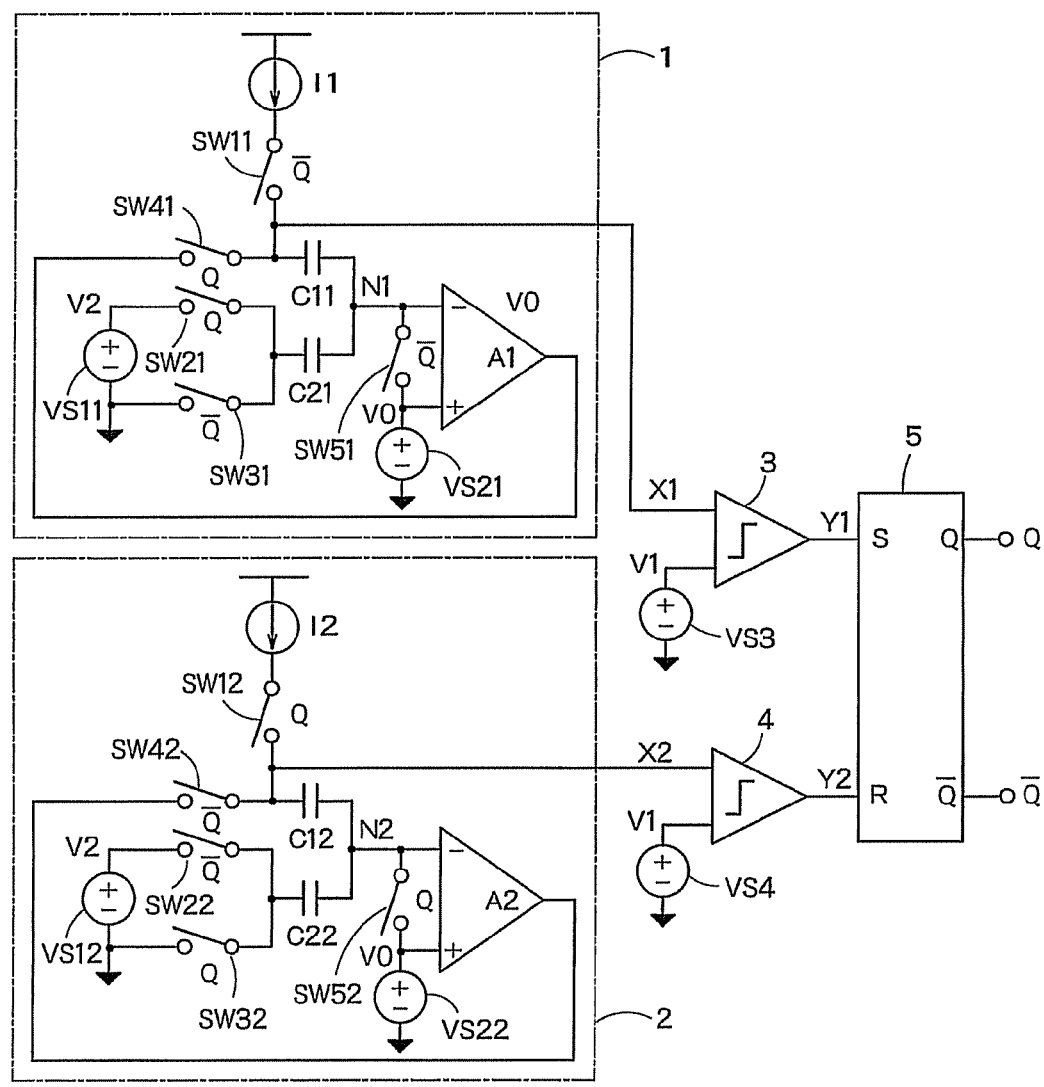
F I G. 1

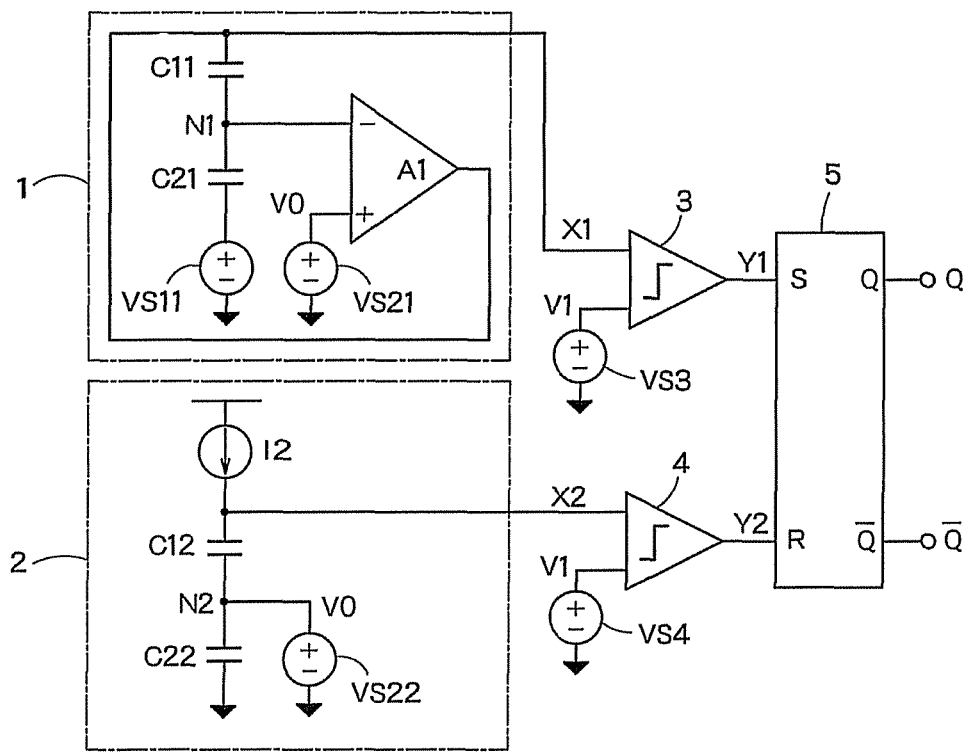
F I G. 3
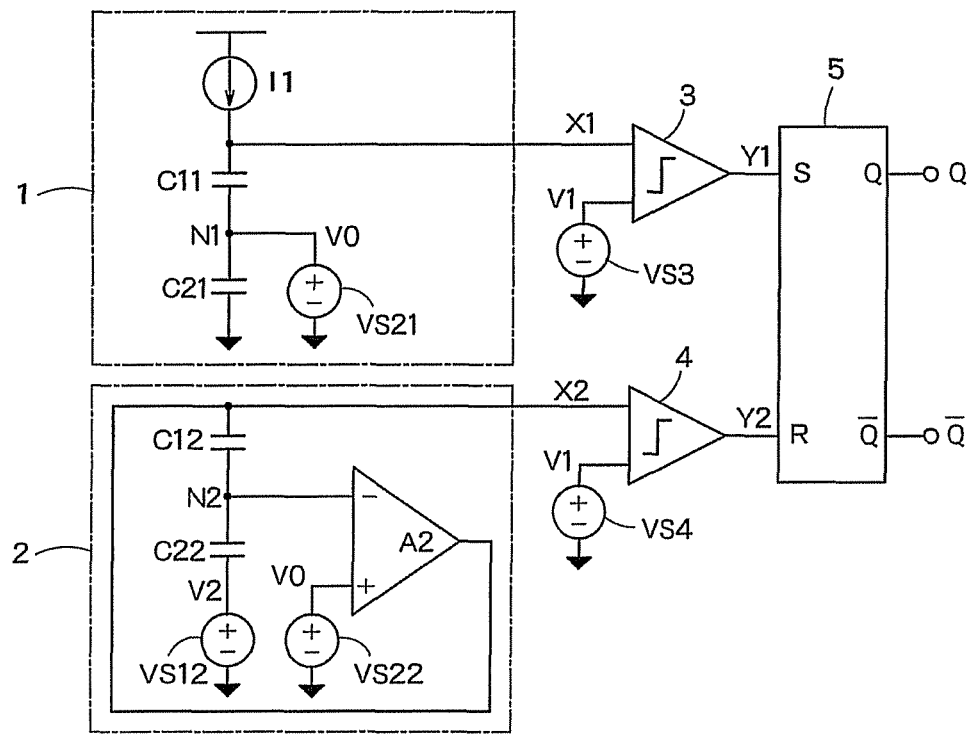
F I G. 4

5a

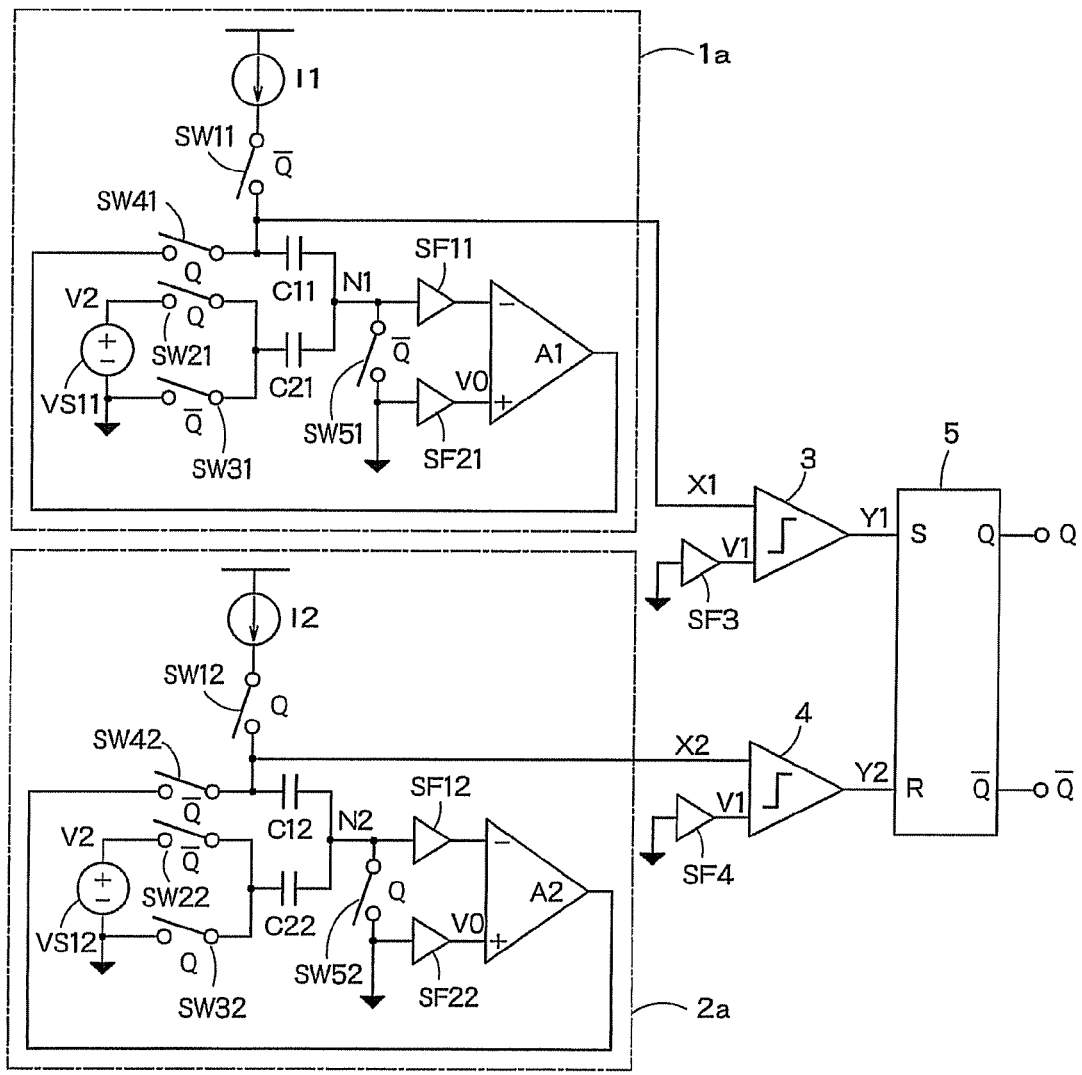
F I G. 9
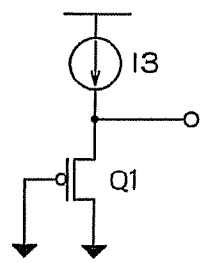
F I G. 10

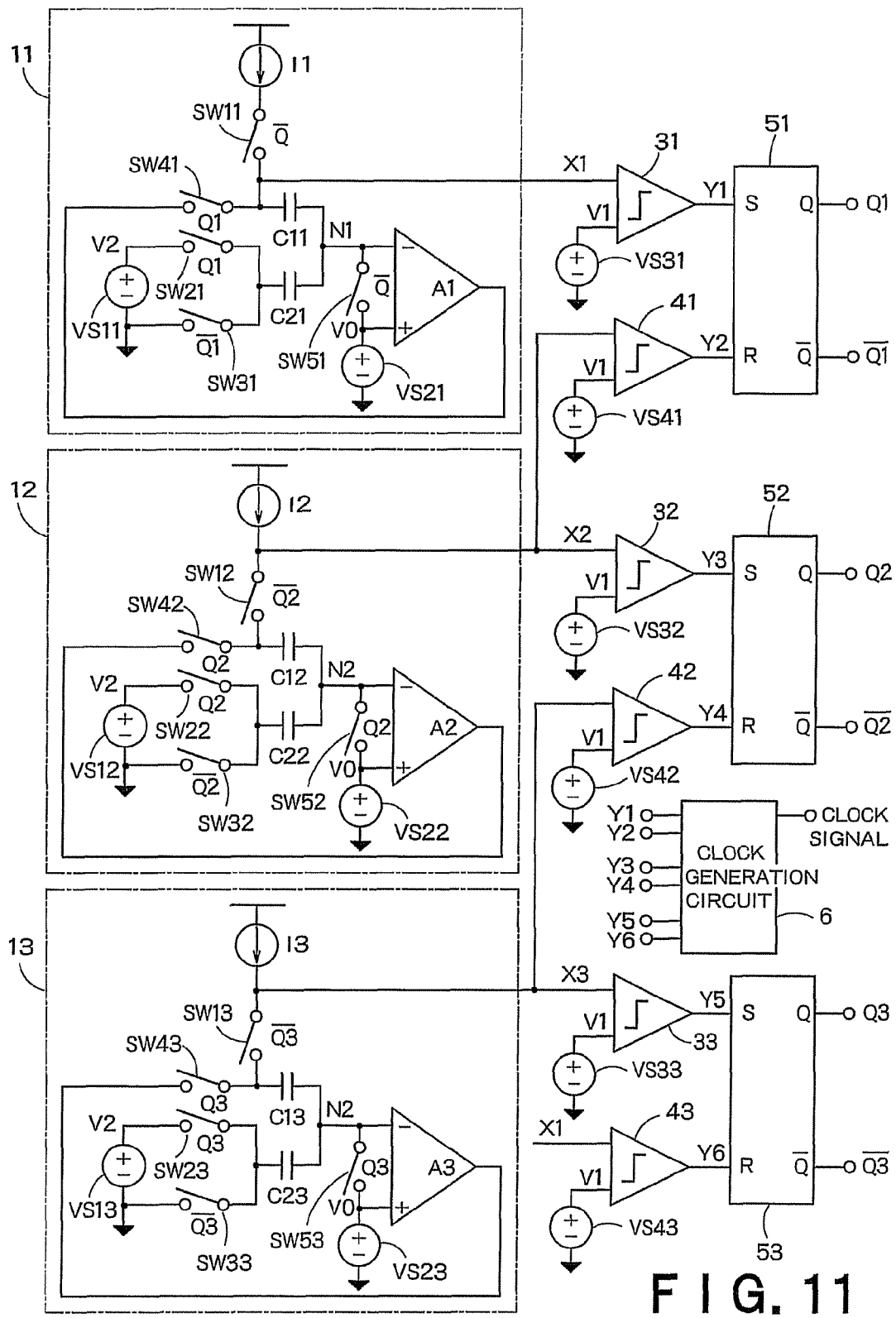
F I G. 11

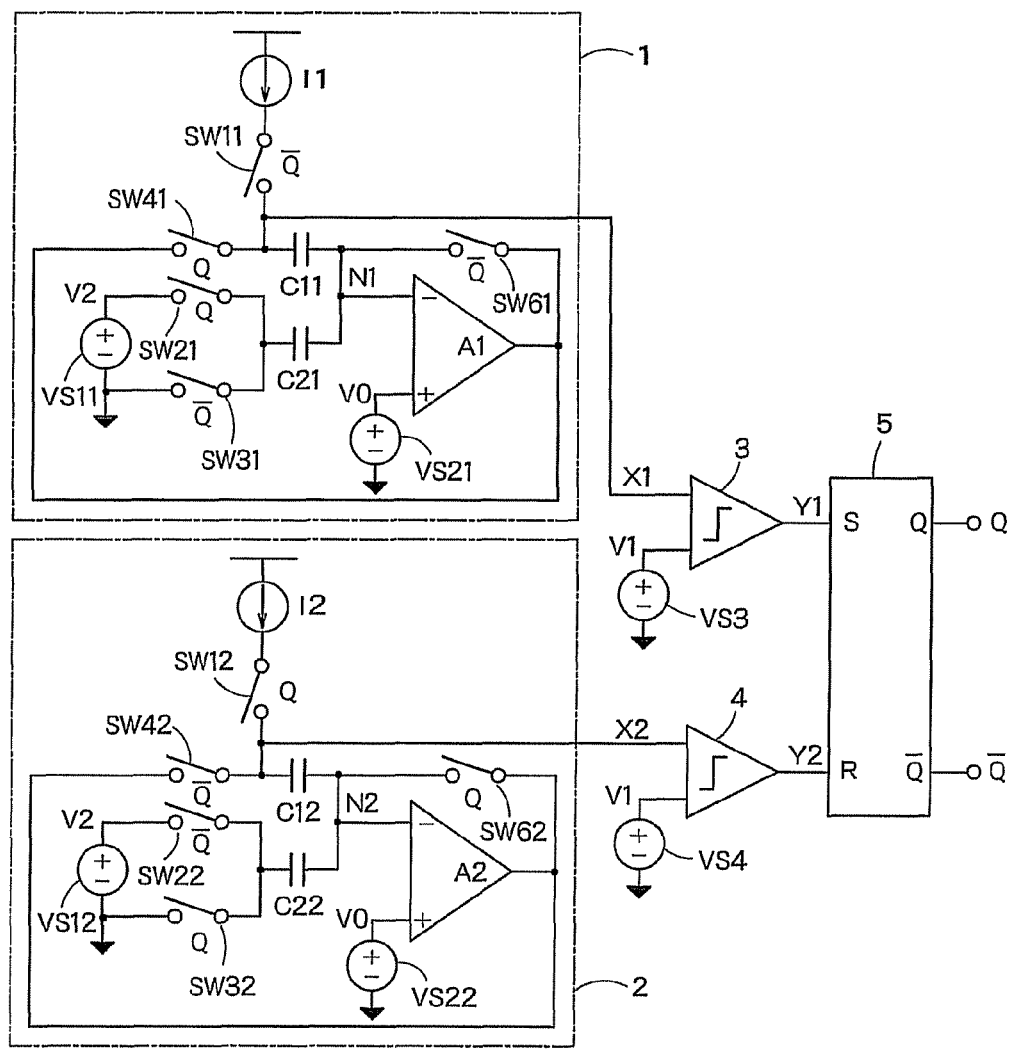
F I G. 13

US 8,565,705 B2

OSCILLATOR CIRCUIT, RADIO COMMUNICATION DEVICE AND SEMICONDUCTOR INTEGRATED CIRCUIT

CROSS REFERENCE TO RELATED APPLICATIONS

This application is based upon and claims the benefit of priority from the prior Japanese Patent Application No. 2010-271543, filed on Dec. 6, 2010, the entire contents of which are incorporated herein by reference.

FIELD

Embodiments described herein relate generally to an oscillator circuit, a radio communication device and a semiconductor integrated circuit.

BACKGROUND

In order to make synchronous circuits operate normally, it is necessary to generate a clock signal whose frequency is stable. By using a crystal oscillator, although a stable clock signal can be generated, it is difficult to generate a clock signal having a high frequency. On the other hand, oscillator circuits on a semiconductor integrated circuit can generate a clock signal having a frequency, while the frequency of the generated clock signal may be unstable due to variation of each of element and/or temperature characteristics.

BRIEF DESCRIPTION OF THE DRAWINGS

FIG. 1 is a circuit configuration of an oscillator circuit according to a first embodiment.

FIG. 3 is a circuit configuration of the oscillator circuit in which the switches are omitted.

FIG. 4 is a circuit configuration in which the switches are omitted.

FIG. 9 is a circuit configuration of an oscillator circuit according to a third embodiment.

FIG. 10 is a circuit configuration showing an example of the source follower.

FIG. 11 is a circuit configuration of an oscillator circuit according to a fourth embodiment.

FIG. 13 is a circuit configuration of an oscillator circuit which is a modified example of FIG. 1.

DETAILED DESCRIPTION

Figure 2:
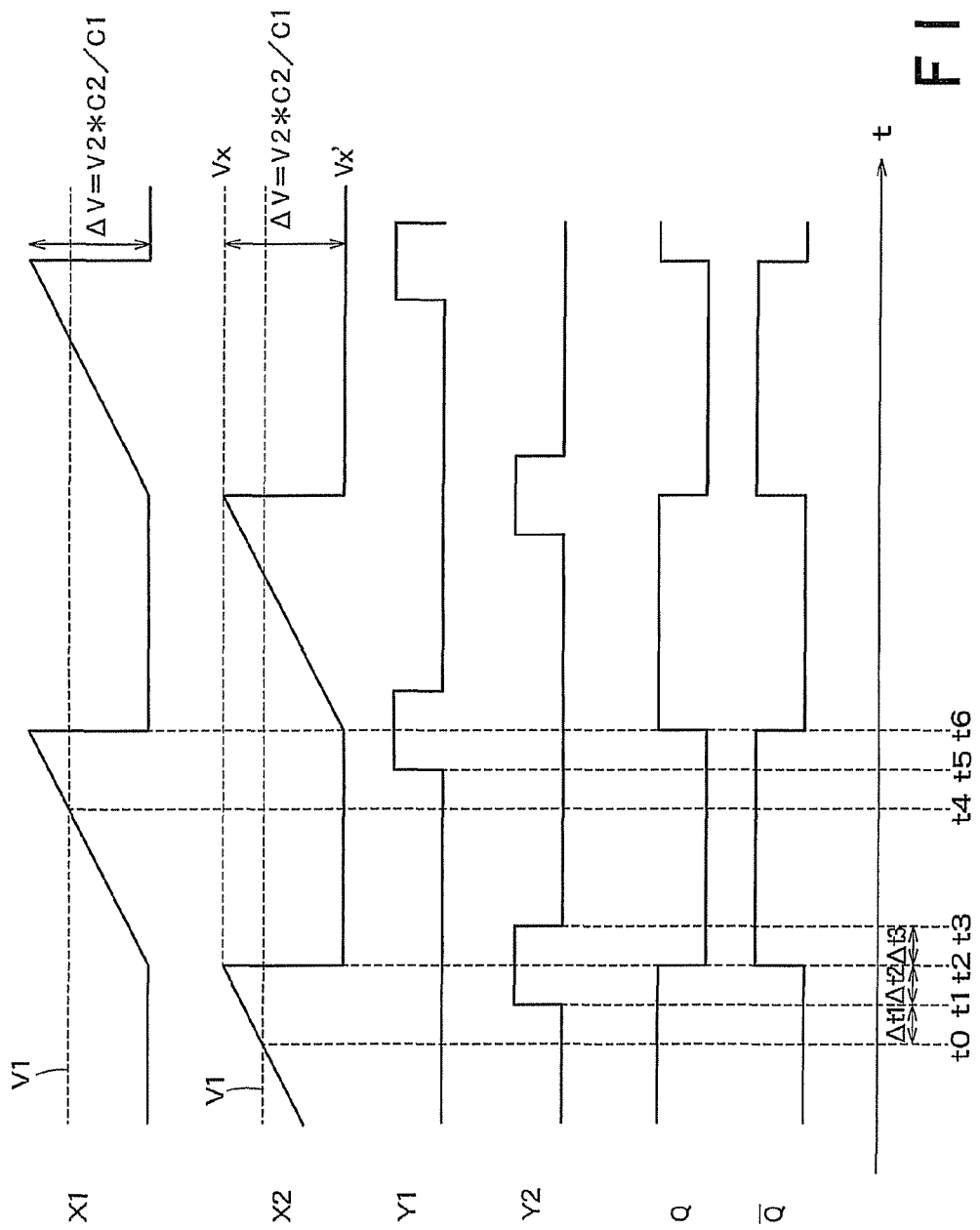
FIG. 2 is a voltage waveform of each signal of the oscillator circuit in FIG. 1.

In general, according to one embodiment, an oscillator circuit includes a first comparator circuit, a second comparator circuit, a first voltage control circuit, a second voltage control circuit, a clock generation circuit. The first comparator circuit is configured to compare a first voltage with a first threshold voltage to generate a first comparison result. The second comparator circuit is configured to compare a second voltage with a second threshold voltage to generate a second comparison result. The first voltage control circuit is configured to decrease the first voltage by a first voltage value in synchronization with timing when the first comparison result changes, and then, increase the first voltage in synchronization with timing when the second comparison result changes. The second voltage control circuit is configured to decrease the second voltage by a second voltage value in synchronization with timing when the second comparison result changes, and then, increase the second voltage in synchronization with timing when the first comparison result changes. The clock generation circuit is configured to generate a clock signal whose phase inverts in synchronization with at least one of the first comparison result and the second comparison result.

Embodiments will now be explained with reference to the accompanying drawings.

First Embodiment

FIG. 1 is a circuit configuration of an oscillator circuit according to a first embodiment. The oscillator circuit of FIG. 1 has voltage control circuits 1 and 2, comparator circuits 3 and 4 and an SR latch (clock generation circuit) 5.

The voltage control circuit 1 has a current source I1, switches SW11 to SW51, capacitors C11 and C12, operation amplifier (Hereinafter, referred to as op-amp) (differential amplifier) A1, voltage sources VS11 and VS21. The current source I1, the switch SW1, the capacitors C11 and C21, the switch SW21 and the voltage source 11 are connected in series between the power supply terminal and the ground terminal. The switch SW31 is connected in parallel with the switch SW 21 and the voltage source VS11. The positive input terminal of the op-amp A1 is connected to the connection node of the capacitors C11 and C21 (Hereinafter, referred to as node N1), and the negative input terminal thereof is connected to the voltage source VS21. The output terminal of the op-amp A1 is connected to the connection node of the switch SW11 and the capacitor C11 through the switch SW41. The switch SW51 is connected between the positive input terminal and the negative input terminal of the op-amp A1. Then, the output signal "X1" of the voltage control circuit 1 is outputted from the connection node of the switch SW11 and the capacitor C11.

The current source I1 is, for example, a pMOS (p-type Metal Oxide Semiconductor) transistor whose gate is supplied with a predetermined bias voltage. Each of the switches is, for example, CMOS (Complementary Metal Oxide Semiconductor) switches. Note that the bar arranged above the signal names in the drawings are shown by "/" preceding the signal names in the present application. The switches attached "Q" is turned on when the signal "Q" is high and turned off when it is low, and those attached "/Q" is turned on when the signal "/Q" is high and turned off when it is low.

The comparator circuit 3 compares the voltage of the signal "X1" (first voltage) with a threshold voltage "V1" (first threshold voltage) generated by the voltage source VS3. When the former is large, the comparator circuit 3 outputs high, and when the latter is large, the comparator circuit 3 outputs low, as a signal "Y1" (first comparison result).

The voltage control circuit 2 and the comparator circuit 4 are similar to the voltage control circuit 1 and the comparator circuit 3, respectively. That is, the comparator circuit 4 compares the voltage of the output signal "X2" (second voltage) with the threshold voltage (second threshold voltage) "V1" to output a signal "Y2" (second comparison result).

Note that, it is assumed that both of the current sources I1 and I2 generate a constant current "I", the capacitance of both of the capacitors C11 and C21 are "C1", those of the capacitor C21 and C22 are "C2". Furthermore, both of the voltage sources VS11 and VS12 generate a constant voltage "V2", and both of the voltage sources VS21 and VS22 generate a constant voltage "V0". The constant voltage "V0" is used for making the op-amps A1 and A2 properly, and not limited to a specific voltage. The constant voltage "V0" is, for example, a half of the supply voltage.

The SR latch 5 outputs the signals "Q" and "/Q" outputted on the output terminals "Q" and "/Q", respectively, in synchronization with timing when the signals "Y1" and "Y2" change. More specifically, the SR latch 5 sets the signal Q to be high in synchronization with a rising edge of the signal "Y1" inputted to the input terminal "S", and sets the signal Q to be low in synchronization with a falling edge of the signal "Y2" inputted to the input terminal "R". Furthermore, the signal "/Q" is an inversed signal of signal "Q". For example, the signal Q can be used as a clock signal.

FIG. 2 is a voltage waveform of each signal of the oscillator circuit in FIG. 1. It is assumed that the signal "Q" is high and the signal "/Q" is low at first. FIG. 3 is a circuit configuration of the oscillator circuit in which the switches are omitted in accordance with the above situation. The current source 12 in the voltage control circuit 2 charges the capacitor C12, and thus, the voltage of the signal "X2" increases gradually. The gradient of the increasing voltage is "I/C1".

When the voltage of the signal "X2" reaches the threshold voltage "V1" at time t0, the comparator circuit 4 sets the signal "Y2" to be high at time t1 which is after the delay time Δt1 from the time t0. Furthermore, the SR latch 5 sets the signal "Q" to be low and the signal "/Q" to be high at time t2 which is after the delay time Δt2 from the time t1. Note that the delay times Δt1 and Δt2 are not always constant due to the temperature characteristics and so on.

Here, when the voltage of the signal "X2" right before the signals "Q" and "/Q" invert is expressed by "Vx", the charges "Q12" and "Q22" charged on the node N2 side of the capacitors C12 and C22 are expressed by the following equations (1) and (2).

$$Q12 = C1*(V0-Vx) \quad (1)$$

$$Q22 = C2*V0 \quad (2)$$

FIG. 4 is a circuit configuration in which the switches are omitted in accordance with a situation where the signal "Q" is low and the signal "/Q" is high. The voltage right after the signals "Q" and "/Q" invert is expressed by "Vx'". Then, the op-amp A2 controls the voltage of the signal "X2" so that the voltage of the node N2 connected to the negative input terminal of the op-amp A2 equals to the voltage V0 of the positive terminal. As a result, the charges "Q12" and "Q22" are expressed by the following equations (3) and (4).

$$Q12' = C1*(V0-Vx') \quad (3)$$

$$Q22' = C2*(V0-V2) \quad (4)$$

Because total amount of the charge on the capacitors C12 and C22 at node N2 side in FIG. 3 is the same as that in FIG. 4, the following equation (5) can be obtained.

$$Q12+Q22 = Q12'+Q22' \quad (5)$$

The following equation (6) can be obtained from the above equations (1) to (5).

$$Vx' = Vx - V2*(C2/C1) \quad (6)$$

That is, the voltage of the signal "X2" drops by a voltage difference ΔV=V2*(C2/C1) at the time t2. As a result, the voltage of the signal "X2" becomes lower than the threshold voltage V1. Therefore, the comparator circuit 4 sets the signal "Y2" to be low at the time t3 which is after the delay time Δt3 from the time t2. Because the switch SW12 of FIG. 1 turns off, the voltage of the signal "X2" does not change, and it again starts to increase at the time t6 when the signal "Q" is set to be high, which will be described below.

The above voltage difference ΔV does not depend on the delay times Δt1 to Δt3 of the comparator circuit 4 and the SR latch 5, and is determined only by the voltage "V2" and the capacitors "C1" and "C2". In other words, even if the delay times Δt1 to Δt3 varies, the voltage difference ΔV is constant.

On the other hand, the voltage of the signal "X1" starts to increase with a gradient of "I/C1" by the current source I1 in the voltage control circuit 1 of FIG. 4 because the signal "/Q" is set to be high at time t2. Then, similar to the operation of the voltage control circuit 2, the signals "Q" and "/Q" are set to be high and low respectively at time t6, and the voltage of the signal "X" decreases by the voltage difference Δ=V2*(C2/C1).

The term from time t2 when the signal "Q" is set to be low, to time t6 when it is set to be high, corresponds to a half of a cycle "T" of the clock signal. It takes this term for the voltage of the signal "X1" to increase by the voltage difference ΔV with a gradient "I/C1". Therefore, the cycle "T" of the clock signal is expressed by the following equation (7).

$$T = 2*V2*C2/I \quad (7)$$

For example, when it is assumed that V2=2.5V, C2=5 pF and I=5 μA, T=$10^{-6}$ s can be obtained, which means that the clock signal having a high frequency of 1 MHz. Furthermore, as is obvious from the above equation (7), the frequency of the clock signal does not depend on the delay signals Δt1 to Δt3 of the comparator circuits 3 and 4 and the SR latch 5. Therefore, the frequency of the clock signal is stable.

Figure 5:
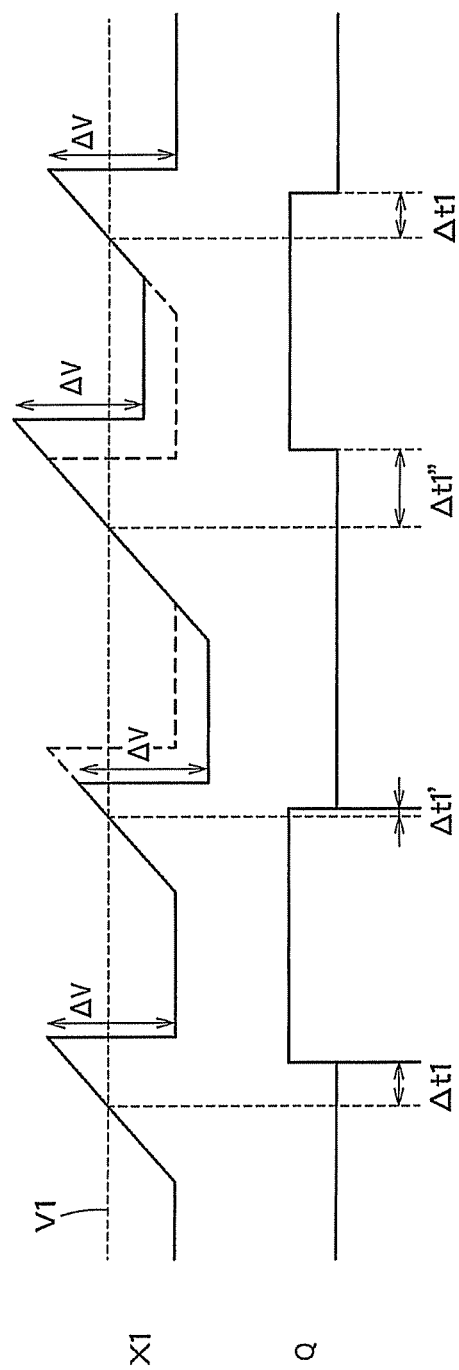
FIG. 5 is a voltage waveform of the signals "X1" and "Q1" when the delay time Δt1 of the comparator circuits 3 and 4 varies.

FIG. 5 is a voltage waveform of the signals "X1" and "Q1" when the delay time Δt1 of the comparator circuits 3 and 4 varies. As shown in FIG. 5, even if the normal delay time Δt1 varies temporally to be Δt1' shorter than the delay time Δt1 or to be Δt1" longer than the delay time Δt1 due to some disturbance or noise, the signal "X1" decreases by a constant voltage difference ΔV. Therefore, the average frequency of the clock signal is not influenced by the variation of the delay time Δt1, and thus, the stable clock signal can be generated.

As described above, in the first embodiment, the voltage of the signals "X1" and "X2" are decreased by the voltage difference ΔV which does not depend on the delay times Δt1 to Δt3 of the comparator circuits 3 and 4 and the SR latch 5 in synchronization with the inversion of the signals "Q" and "/Q". Therefore, it is possible to generate the clock signal having a stable frequency without being influenced from the delay time Δt1 to Δt3.

Note that the threshold voltage inputted to the comparator circuit 3 can be different from that inputted to the comparator circuit 4. Furthermore, the capacitance of the capacitor C11 in the voltage control circuit 1 can be different from that of the capacitor C12 in the voltage control circuit 2. In this case, the voltage drop of the signal "X2" at time t2 of FIG. 2 differs from that of the signal "X1" at time t6. Additionally, instead of the SR latch 5, a clock generation circuit can be provided for generating the clock signal whose phase changes in synchronization with at least one of the signals "Y1" and "Y2".

Second Embodiment

In the first embodiment described above, the signals "Q" and "/Q" invert at substantially the same time. On the other hand, in the second embodiment which will be described below, the signal "Q" inverts, and after that, the signal "/Q" inverts.

Figure 6:
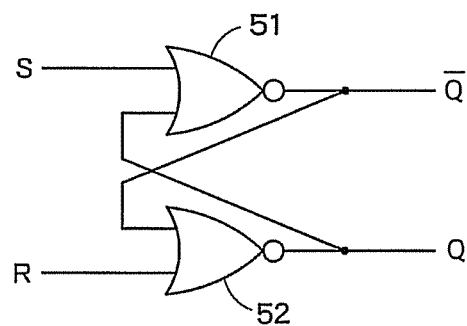
FIG. 6 is a circuit configuration of the SR latch 5a according to a second embodiment.

FIG. 6 is a circuit configuration of the SR latch 5a according to a second embodiment. The SR latch 5a has two NOR circuits 51 and 52. The signals "S" and "Q" are inputted to the NOR circuit 51, and the NOR circuit 51 outputs the signal "/Q". The signals "R" and "/Q" are inputted to the NOR circuit 52, and the NOR circuit 52 outputs the signal "Q".

Figure 7:
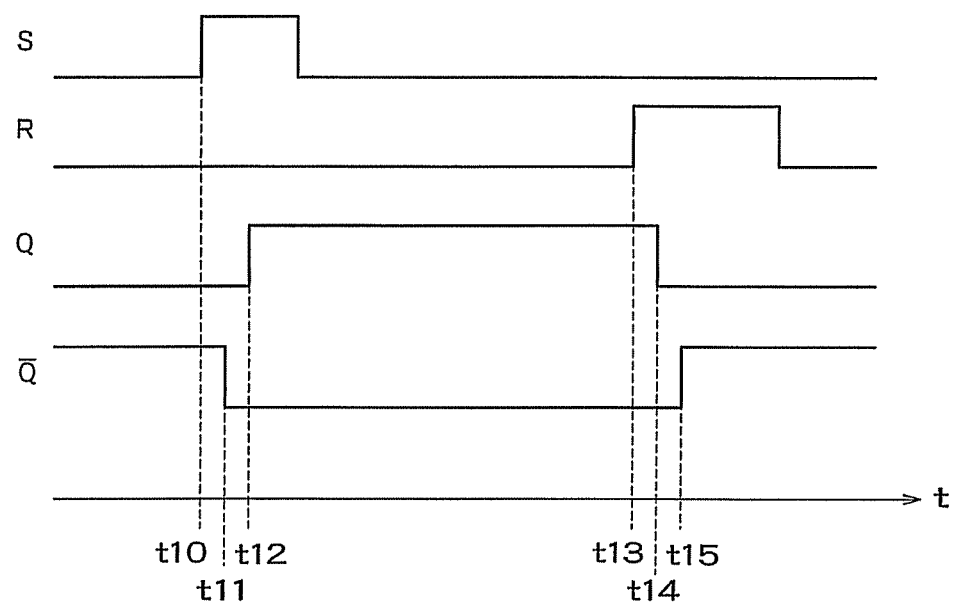
FIG. 7 is a voltage waveform of the input signal and the output signal of the SR latch 5a of FIG. 6.

FIG. 7 is a voltage waveform of the input signal and the output signal of the SR latch 5a of FIG. 6. Firstly, it is assumed that the signals "S" and "R" are low and the signal "/Q" is high. When the signal "S" rises up to be set high at time t10, the NOR circuit 51 sets the signal "/Q" to be low at time t11 which is after the delay time from time t10. When the signal "/Q" is set to be low, the NOR circuit 52 sets the signal "Q" to be high at time t12 which is after the delay time from time t12. Even when the signal "S" is set to be low after that, the signals "Q" and "/Q" do not change.

Then, when the signal "R" rises up to be set high at time t13, the NOR circuit 52 sets the signal "Q" to be low at time t14 which is after the delay time from time t13. When the signal "Q" is set to be low, the NOR circuit 51 sets the signal "/Q" to be high at time t15 which is after the delay time from time t14. Even when the signal "R" is set to be low after that, the signals "Q" and "/Q" do not change.

As described above, the signals "Q" and "/Q" are not set to be high at the same time. This means that the switches of FIG. 1 which turn on when the signal "Q" is high (SW21, SW41 and so on) and those which turn on when the signal "/Q" is high (SW11, SW31, SW51 and so on) are not turned on simultaneously. Thus, it is possible to prevent the oscillator circuit from false operation.

Figure 8:
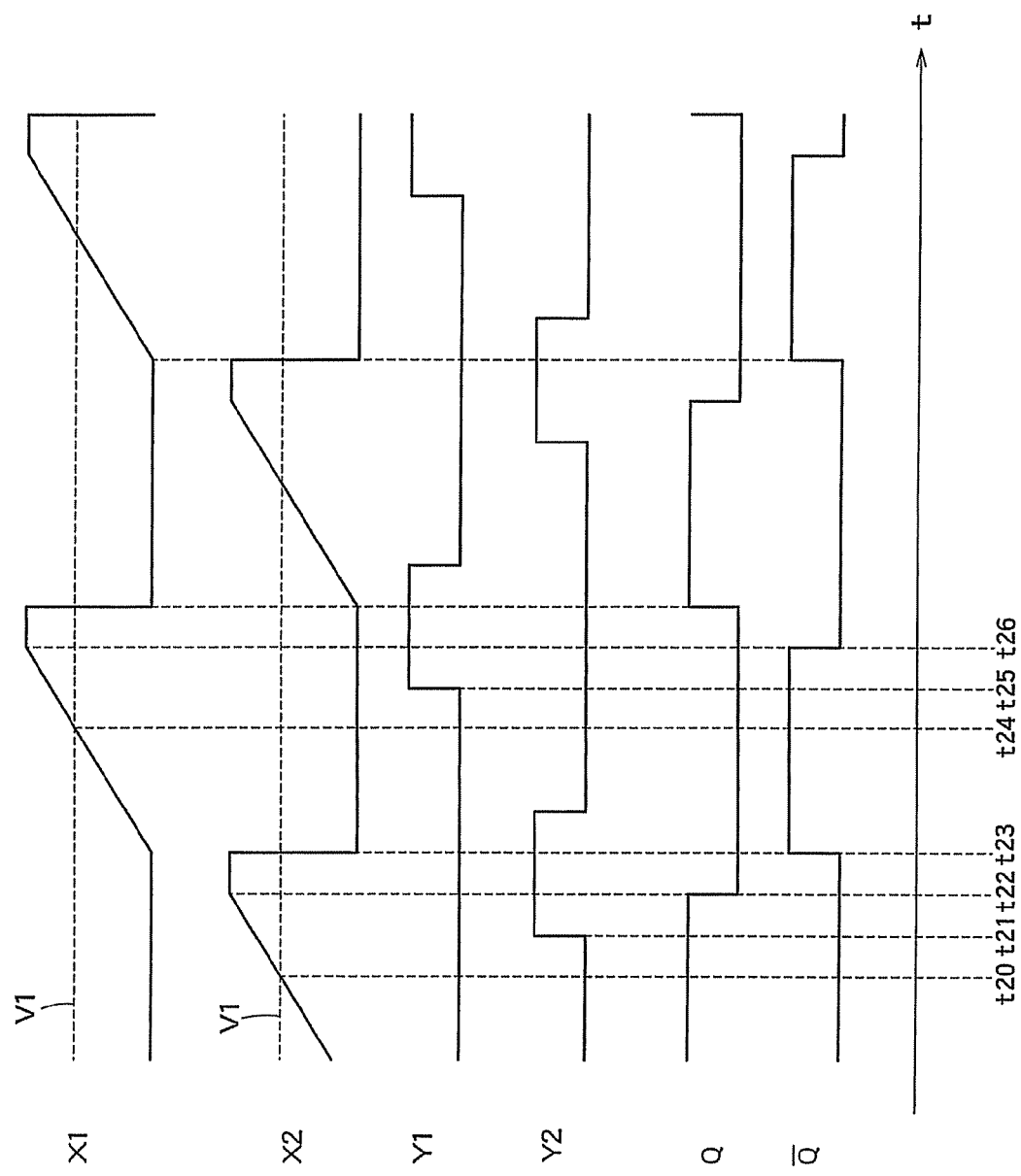
FIG. 8 is a voltage waveform of each signal of the oscillator circuit having the SR latch 5a of FIG. 6.

FIG. 8 is a voltage waveform of each signal of the oscillator circuit having the SR latch 5a of FIG. 6. Hereinafter, difference from FIG. 2 will be mainly described.

Since the signal "Q" is high and the signal "/Q" is low before time t20, the switches SW21 and SW41 in the voltage control circuit 1 of FIG. 1 and switches SW12, SW32 and SW52 in the voltage control circuit 2 are turned on. When the voltage of the signal "X2" reaches the threshold voltage "V1" at time t20, the comparator circuit 4 sets the signal "Y2" to be high at time t21. Then, the SR latch 5a sets the signal "Q" to be low at time t22, firstly. Because of this, all of the switches in FIG. 1 are turned off, which stops increasing the voltage of the signal "X2".

After that, the SR latch 5a sets the signal "/Q" to be high at time t23. As a result, the switches SW11, SW31 and SW51 in the voltage control circuit 1 and the switches SW12, SW22 and SW42 in the voltage control circuit 2 are turned on. Because of this, the voltage of the signal "X" decreases by the voltage difference 1W and the voltage of the signal "X1" starts to increase. That is, the voltage control circuit 2 stops increasing the voltage of the signal "X2" at time t22, and after that, the voltage control circuit 1 increases the voltage of the signal "X1".

As stated above, in the second embodiment, the SR latch 5a generates the signals "Q" and "/Q" so that the switches which turn on when the signal "Q" is high and those which turn on when the signal "/Q" is high do not turn on at the same time.

Therefore, it is possible to prevent the voltage control circuits 1 and 2 from false operation, and further stable clock signal can be generated.

Third Embodiment

In the third embodiment, voltages are supplied to the op-amps A1 and A2 and comparators 3 and 4 by using source followers.

FIG. 9 is a circuit configuration of the oscillator circuit according to a third embodiment. The difference from the oscillator circuit of FIG. 1 is that the operation amplifiers A1 and A2 and the comparators 3 and 4, in the voltage control circuits 1a and 2a, are supplied with voltages through source followers SF11, SF12, SF21, SF22, SF3 (first threshold voltage generator) and SF4 (second threshold voltage generator), respectively.

FIG. 10 is a circuit configuration showing an example of the source follower. The source follower has a current source 13 and a pMOS transistor Q1 which are connected in series. The gate and the drain of the pMOS transistor Q1 are connected to the ground terminal, and an output voltage, which is higher than the ground voltage by the threshold voltage of the pMOS transistor Q1, is obtained from the connection node of the current source 13 and the pMOS transistor Q1.

By using the source follower to which the ground voltage is inputted, even when the output voltage of the circuit such as the op-amps A1 and A2 and the comparators 3 and 4, the output voltage of the source follower hardly varies. Therefore, the voltage difference ΔV and the threshold voltage "V1" of the comparator circuits 3 and 4 become stable, thereby, generating a stable clock signal.

Note that the threshold voltage V1 should be higher than the voltage difference ΔV. Therefore, it is necessary to use the pMOS transistor Q1 having a threshold voltage higher than the voltage difference ΔV for the source follower. In the above numerical example, since ΔV=0.5V, the pMOS transistors having a threshold voltage of, for example, 0.7V can be used.

Fourth Embodiment

In a fourth embodiment, the oscillator circuit has three or more voltage control circuits.

FIG. 11 is a circuit configuration of an oscillator circuit according to a fourth embodiment. The oscillator circuit of FIG. 11 has three voltage control circuits 11 to 13, comparator circuits 31 to 33 and 41 to 43, SR latches 51 to 53, and a clock generation circuit 6. The comparator circuits 31 to 33 and 41 to 43 and the SR latches 51 to 53 correspond to the voltage control circuits 11 to 13, respectively. The clock generation circuit 6 generates the clock signal based on the output signals "Y1" to "Y6" of the comparator circuits.

Figure 12:
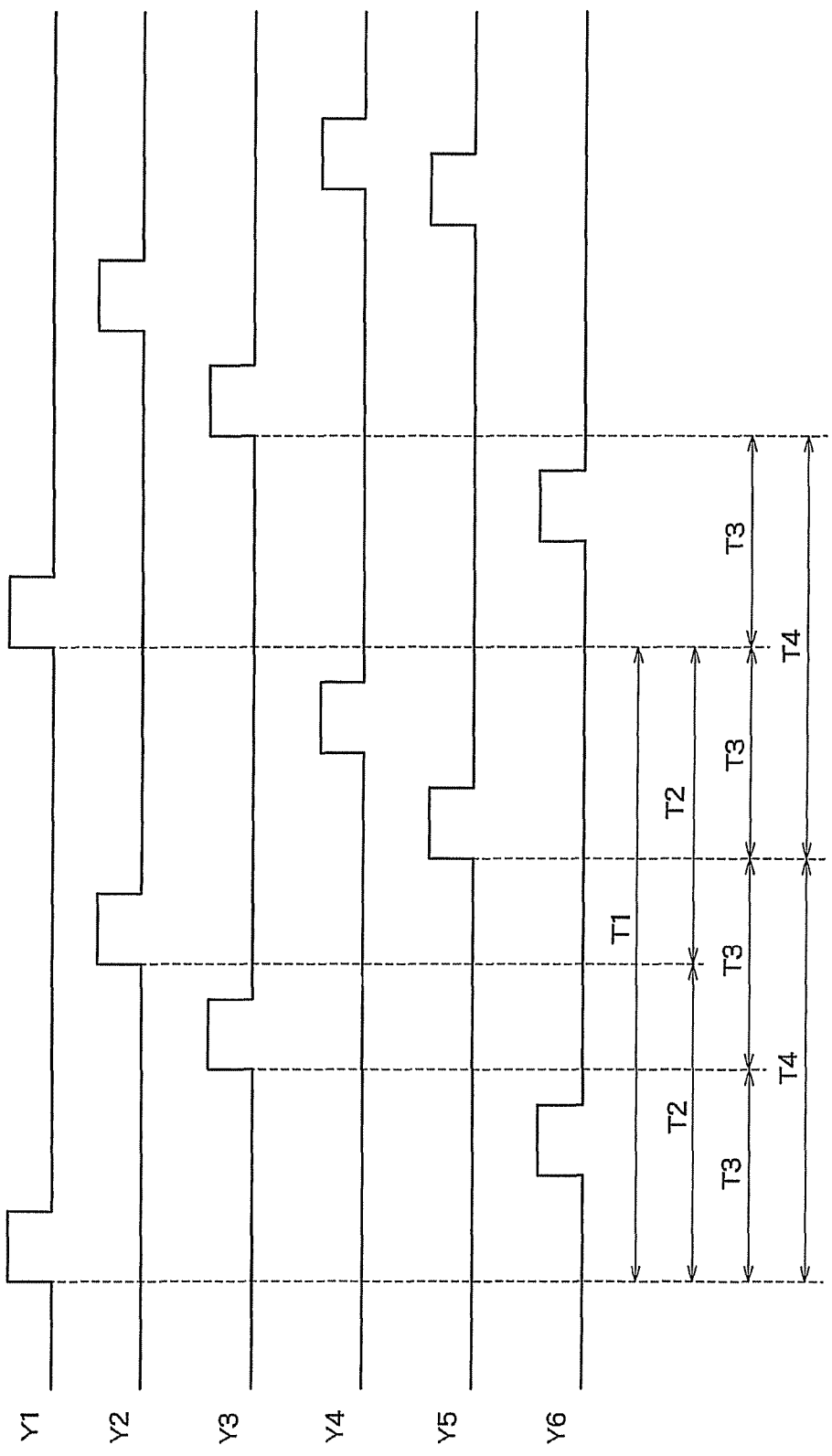
FIG. 12 is a voltage waveform of the output signals "Y1" to "Y6".

FIG. 12 is a voltage waveform of the output signals "Y1" to "Y6" of the comparator circuits 31 to 33 and 41 to 43, respectively. As shown in FIG. 12, the signals "Y1", "Y3" and "Y5", whose phase are shifted by "120" degree from each other, are generated. The phase of the signals "Y2", "Y4" and "Y6" are shifted by "180" degree from the signal "Y1", "Y3" and "Y5", respectively.

The clock generation circuit 6 can, for example, generate a first clock signal having a cycle "T1" whose phase inverts in synchronization with the rising edge of the signal "Y1". Furthermore, the clock generation circuit 6 can generate a second clock signal having a cycle T2=T1/2, namely, the frequency thereof is twice as that of the first clock signal. The phase of the second clock inverts in synchronization with the rising edges both of the signals "Y1" and "Y2". Additionally, the clock generation circuit 6 can generate a third clock signal having a cycle T3=T1/3, namely, the frequency thereof is three times as that of the first clock signal. The phase of the third clock inverts in synchronization with the rising edges of the signals "Y1", "Y3" and "Y5". Further, the clock generation circuit 6 can generate a fourth clock signal having a cycle T4=2*T1/3, namely, the frequency thereof is "1.5" times as that of the first clock signal. The phase of the third clock inverts in synchronization with the rising edges of the signals "Y1" and "Y5". In addition, the clock generation circuit 6 can generate clock signals having various frequencies in synchronization with arbitrary signals "Y1" to "Y6" simply.

FIG. 12 shows an example where the oscillator has three voltage control circuits. However, the oscillator circuit can have four or more voltage control circuit, by which clock signals having various frequencies different from each other can be generated.

As stated above, in the fourth embodiment, three or more voltage control circuits are provided in the oscillator circuit. Therefore, clock signals whose frequencies are different from each other can be simply generated.

The oscillator circuits of FIG. 1 and so on are only examples, and various modifications can be conceivable. For example, at least a part of MOS transistors can be replaced by other semiconductor devices such as bipolar transistors or Bi-CMOS transistors. Furthermore, it is possible to form the circuit by reversing the conductivity type of the transistor while correspondingly reversing the positions of the power source terminal and the earth terminal. Also in this case, the fundamental operating principle is the same.

For example, FIG. 13 is a circuit configuration of an oscillator circuit which is a modified example of FIG. 1. Although the circuit configuration of FIG. 13 is different from that of FIG. 1, the voltages of the signals "X1" and "X2" decrease by the constant voltage difference ΔV when they reach the threshold voltage "V1".

The oscillator circuit can be formed on a semiconductor substrate or on a plurality of semiconductor chips separately. Furthermore, the clock generating circuit can be implemented by using discrete parts on a printed circuit board and so on.

Figure 14:
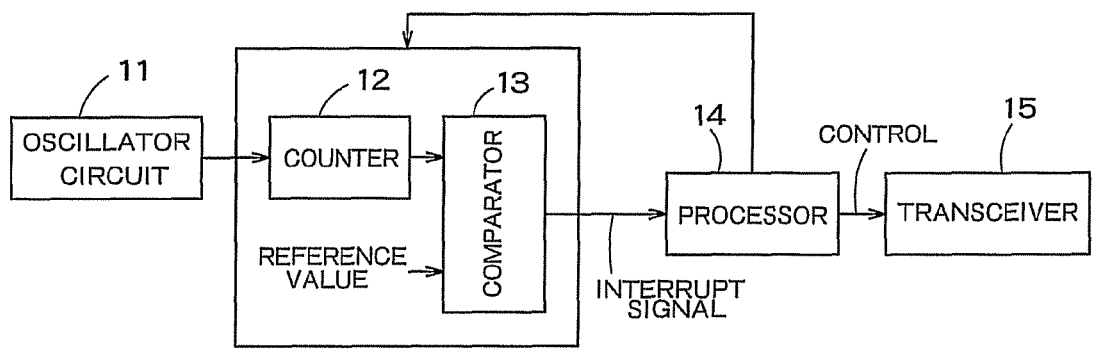
FIG. 14 is a schematic block diagram of a radio communication device 10.

The oscillator circuits, described in each of the embodiment, can be used in a radio communication device, for example. FIG. 14 is a schematic block diagram of a radio communication device 10. The radio communication device 10 has an oscillator circuit 11, a counter 12, a comparator 13, a processor 14, and a transceiver 15.

The oscillator circuit 11 can be one described in one of the embodiments; and generates a clock signal. The counter 12 counts the number of pulses of the clock signals. The comparator 13 compares the count value with a reference value predetermined by the processor 14. When the count value exceeds the reference value, the comparator 13 generates an interrupt signal.

The processor 14 is activated from a low-power mode in synchronization with the interrupt signal to activate the transceiver 15 from a low-power mode. Then, the processor 14 activates the transceiver 15 to confirm the radio wave condition and/or connection condition. After that, the processor 14 sets the next activation time, and the processor 14 and the transceiver 15 get into the low-power mode again. The transceiver 15 transmits information to and receives information from outside apparatuses.

The radio communication device 11 does not have to operate all the time, and the consumption power can be reduced by intermittent operation including a low-power mode. However, in order to surely response to the communication request from communication apparatuses, it is necessary to maintain a connection condition with the communication apparatuses.

The oscillation circuit according to the present embodiments can generate a clock signal having a stable frequency, and perform the intermittent operation in synchronization with the clock signal. Therefore, the radio wave condition and connection condition can be confirmed regularly, thereby maintaining the connection condition with the communication apparatuses.

The radio communication device 11 also can be used for input/output devices such as touch panels, mice and so on.

Figure 15:
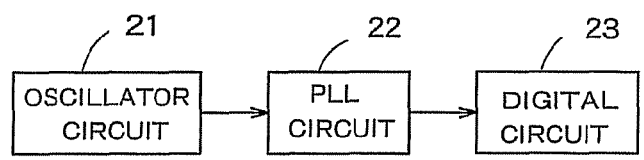
FIG. 15 is a schematic block diagram of a semiconductor integrated circuit 20.

Furthermore, the oscillation circuit can be used for generating a clock signal for digital circuits in a general semiconductor integrated circuit. FIG. 15 is a schematic block diagram of a semiconductor integrated circuit 20. The semiconductor integrated circuit 20 has an oscillation circuit 21, a PLL (Phase Locked Loop) circuit 22, and a digital circuit 23.

The oscillation circuit 11 is one explained in the above embodiments and generates a reference clock. The PLL circuit generates a clock signal in synchronization with the reference signal. The digital circuit 22 operates in synchronization with the clock signal.

Since the oscillation circuit can be integrated on the semiconductor substrate, it is unnecessary to provide an extra crystal oscillator for generating the reference signal.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

The invention claimed is:

1. An oscillator circuit comprising:
   a first comparator circuit configured to compare a first voltage with a first threshold voltage to generate a first comparison result;
   a second comparator circuit configured to compare a second voltage with a second threshold voltage to generate a second comparison result;
   a first voltage control circuit configured to decrease the first voltage by a first voltage value in synchronization with timing when the first comparison result changes, and then, increase the first voltage in synchronization with timing when the second comparison result changes;
   a second voltage control circuit configured to decrease the second voltage by a second voltage value in synchronization with timing when the second comparison result changes, and then, increase the second voltage in synchronization with timing when the first comparison result changes; and
   a clock generation circuit configured to generate a clock signal whose phase inverts in synchronization with at least one of the first comparison result and the second comparison result.

2. The circuit of claim 1, wherein the first voltage value and the second voltage value are independent of delay times of the first comparator circuit, the second comparator circuit and the clock generation circuit.

3. The circuit of claim 1, wherein
   the second voltage control circuit is configured to increase the second voltage after the first voltage control circuit stops increasing the first voltage, and the first voltage control circuit is configured to increase the first voltage after the second voltage control circuit stops increasing the second voltage.

4. The circuit of claim 1 further comprising:
a first threshold voltage generation circuit configured to generate the first threshold voltage based on a ground voltage; and
a second threshold voltage generation circuit configured to generate the second threshold voltage based on the ground voltage.

5. The circuit of claim 4, wherein each of the first and the second threshold voltage generation circuits comprises:
a current source; and
a MOS (Metal Oxide Semiconductor) transistor comprising a gate, a source and a drain, the gate and the source being supplied with the ground voltage, the drain being supplied with a current by the current source,
wherein the first threshold voltage or the second threshold voltage is generated from the drain of the MOS transistor.

6. The circuit of claim 5, wherein
a threshold voltage of the MOS transistor in the first threshold voltage generation circuit is higher than the first voltage value, and
a threshold voltage of the MOS transistor in the second threshold voltage generation circuit is higher than the second voltage value.

7. The circuit of claim 1, wherein the first voltage control circuit comprises:
a first current source, a first switch, a first capacitor, a second capacitor, a second switch and a first voltage source connected in series between a power supply terminal and a ground terminal;
a third switch connected in parallel with the second switch and the first voltage source;
a second voltage source;
a fourth switch;
a first differential amplifier comprising a first input terminal, a second input terminal and an output terminal, the first input terminal being connected to a connection node of the first capacitor and the second capacitor, the second input terminal being connected to the second voltage source, an output terminal being connected to a connection node of the first switch and the first capacitor through the fourth switch; and
a fifth switch connected between the first input terminal and the second input terminal of the first differential amplifier,
wherein the first voltage is outputted from the connection node of the first switch and the first capacitor.

8. The circuit of claim 7, wherein the first voltage value is determined according to the first voltage source, the first capacitor and the second capacitor.

9. The circuit of claim 7, wherein
the second switch and the fourth switch turn on at substantially the same time, and
the first switch, the third switch and the fifth switch turn on at substantially the same time and when the second switch is off.

10. The circuit of claim 1, wherein the second voltage control circuit comprises:
a second current source, a sixth switch, a third capacitor, a fourth capacitor, a seventh switch and a third voltage source connected in series between a power supply terminal and a ground terminal;
an eighth switch connected in parallel with the seventh switch and the third voltage source;

a fourth voltage source;
a ninth switch;
a second differential amplifier comprising a third input terminal, a fourth input terminal and an output terminal, the third input terminal being connected to a connection node of the third capacitor and the fourth capacitor, the fourth input terminal being connected to the fourth voltage source, an output terminal being connected to a connection node of the sixth switch and the third capacitor through the ninth switch; and
a tenth switch connected between the third input terminal and the fourth input terminal of the second differential amplifier,
wherein the second voltage is outputted from the connection node of the sixth switch and the third capacitor.

11. The circuit of claim 10, wherein the second voltage value is determined according to the third voltage source, the third capacitor and the fourth capacitor.

12. The circuit of claim 10, wherein
the seventh switch and the ninth switch turn on at substantially the same time, and
the sixth switch, the eighth switch and the tenth switch turn on at substantially the same time and when the seventh switch is off.

13. A radio communication device comprising:
a transceiver configured to transmit and receive a signal;
an oscillator circuit configured to generate a clock signal;
a counter configured to count the number of pulses of the clock signal;
a comparator configured to compare a count value of the counter with a predetermined reference value to generate an interrupt signal;
a processor activated from a low-power mode in synchronization with the interrupt signal, and configured to control the transceiver,
wherein the oscillator circuit comprises:
a first comparator circuit configured to compare a first voltage with a first threshold voltage to generate a first comparison result;
a second comparator circuit configured to compare a second voltage with a second threshold voltage to generate a second comparison result;
a first voltage control circuit configured to decrease the first voltage by a first voltage value in synchronization with timing when the first comparison result changes, and then, increase the first voltage in synchronization with timing when the second comparison result changes;
a second voltage control circuit configured to decrease the second voltage by a second voltage value in synchronization with timing when the second comparison result changes, and then, increase the second voltage in synchronization with timing when the first comparison result changes; and
a clock generation circuit configured to generate a clock signal whose phase inverts in synchronization with at least one of the first comparison result and the second comparison result.

14. The device of claim 13, wherein the first voltage value and the second voltage value are independent of delay times of the first comparator circuit, the second comparator circuit and the clock generation circuit.

15. The device of claim 13, wherein
the second voltage control circuit is configured to increase the second voltage after the first voltage control circuit stops increasing the first voltage, and the first voltage control circuit is configured to increase the first voltage after the second voltage control circuit stops increasing the second voltage.

16. The device of claim 13 further comprising:
a first threshold voltage generation circuit configured to generate the first threshold voltage based on a ground voltage; and
a second threshold voltage generation circuit configured to generate the second threshold voltage based on the ground voltage.

17. The device of claim 16, wherein each of the first and the second threshold voltage generation circuits comprises:
a current source; and
a MOS (Metal Oxide Semiconductor) transistor comprising a gate, a source and a drain, the gate and the source being supplied with the ground voltage, the drain being supplied with a current by the current source,
wherein the first threshold voltage or the second threshold voltage is generated from the drain of the MOS transistor.

18. The device of claim 17, wherein
a threshold voltage of the MOS transistor in the first threshold voltage generation circuit is higher than the first voltage value, and
a threshold voltage of the MOS transistor in the second threshold voltage generation circuit is higher than the second voltage value.

19. A semiconductor integrated circuit comprising:
an oscillator circuit configured to generate a reference signal; and
a digital circuit configured to operate in synchronization with the reference signal,
wherein the oscillator circuit comprising:
a first comparator circuit configured to compare a first voltage with a first threshold voltage to generate a first comparison result;
a second comparator circuit configured to compare a second voltage with a second threshold voltage to generate a second comparison result;
a first voltage control circuit configured to decrease the first voltage by a first voltage value in synchronization with timing when the first comparison result changes, and then, increase the first voltage in synchronization with timing when the second comparison result changes;
a second voltage control circuit configured to decrease the second voltage by a second voltage value in synchronization with timing when the second comparison result changes, and then, increase the second voltage in synchronization with timing when the first comparison result changes; and
a clock generation circuit configured to generate a clock signal whose phase inverts in synchronization with at least one of the first comparison result and the second comparison result.

20. The circuit of claim 19 further comprising a PLL circuit configured to generate a clock signal in synchronization with the reference signal,
wherein the digital circuit is configured to operate in synchronization with the clock signal.

* * * * *